(12) United States Patent
Ayadi et al.

(10) Patent No.: US 6,445,630 B2
(45) Date of Patent: Sep. 3, 2002

(54) METHOD FOR CARRYING OUT A BURN-IN PROCESS FOR ELECTRICALLY STRESSING A SEMICONDUCTOR MEMORY

(75) Inventors: Kamel Ayadi, Puchheim; Jürgen Lindolf, Friedberg; Nedim Oezoguz-Geissler, Taufkirchen, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/816,924

(22) Filed: Mar. 23, 2001

(30) Foreign Application Priority Data

Mar. 23, 2000 (DE) .......................... 100 14 388

(51) Int. Cl.⁷ ................................................ G11C 7/00
(52) U.S. Cl. ...................................... 365/201; 365/149
(58) Field of Search .................................. 365/201, 149

(56) References Cited

U.S. PATENT DOCUMENTS

| | | | |
|---|---|---|---|
| 4,751,679 A | * 6/1988 | Dehganpour | ................. 365/201 |
| 5,424,990 A | 6/1995 | Ohsawa | |
| 5,557,559 A | 9/1996 | Rhodes | |
| 5,636,171 A | 6/1997 | Yoo et al. | |
| 5,748,543 A | 5/1998 | Lee et al. | |
| 5,872,797 A | 2/1999 | Theodoseau | |
| 5,898,186 A | 4/1999 | Farnworth et al. | |
| 5,917,765 A | 6/1999 | Morishita et al. | |
| 5,976,899 A | 11/1999 | Farnworth et al. | |
| 5,986,917 A | 11/1999 | Lee | |
| 6,018,485 A | 1/2000 | Cha et al. | |
| 6,038,181 A | 3/2000 | Braceras et al. | |

FOREIGN PATENT DOCUMENTS

| | | |
|---|---|---|
| DE | 196 03 107 A1 | 7/1997 |
| EP | 0 574 002 B1 | 12/1993 |
| WO | WO 82/00917 | 3/1982 |

OTHER PUBLICATIONS

Zhi Chen et al.: On the mechanism for Interface Trap Generation in MOS Transistors Due to Channel Hot Carrier Stressing, IEEE Electronic Device Letters, vol. 21, No. 1, Jan. 2000, pp. 24–26.

* cited by examiner

*Primary Examiner*—Huan Hoang
(74) *Attorney, Agent, or Firm*—Laurence A. Greenberg; Werner H. Stemer; Ralph E. Locher

(57) ABSTRACT

A circuit configuration is described that has a first voltage terminal, a second voltage terminal and a control input. A reference-ground potential is applied to the first voltage terminal and an operating voltage is applied to the second voltage terminal. The control input is supplied with a control voltage, the control voltage assumes voltage values which alternate between the reference-ground potential and the operating voltage. The alternation of the control voltage has the effect that components such as transistors and inverter that are present in the circuit configuration are active and thereby experience an accelerated aging process in order to stabilize the threshold voltage of the MOS transistor.

7 Claims, 3 Drawing Sheets

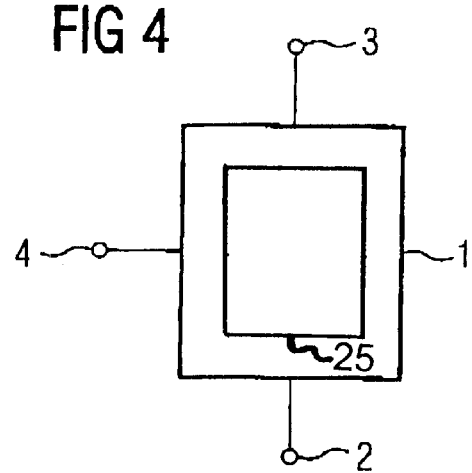
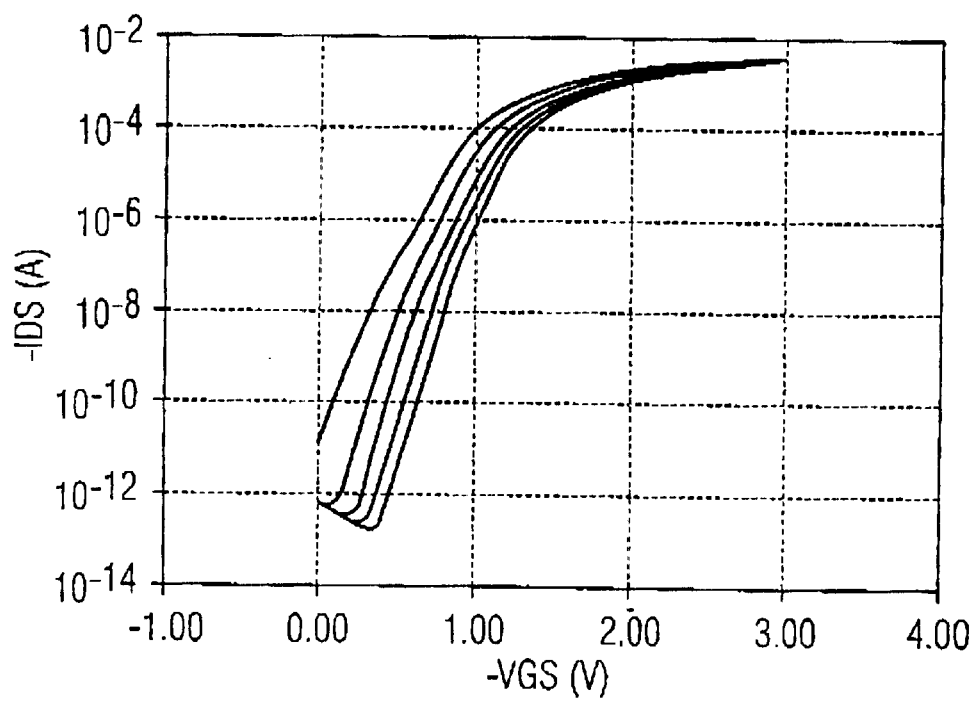

METHOD FOR CARRYING OUT A BURN-IN PROCESS FOR ELECTRICALLY STRESSING A SEMICONDUCTOR MEMORY

BACKGROUND OF THE INVENTION

Field of the Invention

The invention relates to a method for carrying out a burn-in process for electrically stressing a semiconductor memory.

Semiconductor memories are used to store information and can be realized as a semiconductor component. One semiconductor memory is e.g. a dynamic random access memory (DRAM). It contains a cell array with memory cells and an addressing periphery. The memory cells of the memory cell array contain a selection transistor and a storage capacitor. The addressing periphery is usually formed from transistors fabricated using CMOS technology. CMOS denotes Complimentary Metal Oxide Semiconductor and contains both N-MOS and P-MOS transistors.

In order to ensure that the transistors used have high reliability over the entire lifetime of a memory product, a burn-in process is carried out. The dictates of production result in that transistors are not able to maintain an identical behavior throughout their lifetime, which is reflected in an input and output characteristic curve that is changed over time. The change in the transistors is caused e.g. by "hot carrier injection" (injection of high-energy charge carriers), which affects transistors having a short channel length to an increasing extent. The threshold voltage of a freshly produced transistor is not stable since high-energy charge carriers are accumulating in the gate oxide when the transistor is operating. The introduction of a burn-in process makes it possible to stabilize the transistor properties at a constant value. The threshold stabilization is carried out during the burn-in phase, while the memory is in a test environment, so that the transistor has stable properties during operation. The burn-in processes are usually carried out in a furnace in which the memories are exposed to an elevated temperature. Documents that describe the performance of a burn-in include U.S. Pat. Nos. 5,976,899; 5,917,765; 5,898,186; 5,748,543; 5,636,171; and 6,018,485. Two documents that describe circuits for carrying out a burn-in process are U.S. Pat. Nos. 5,986,917 and 5,424,990. Further insights on the stressing of MOS transistors can be found in the reference by Zhi Chen et. al., titled "On the Mechanism for Interface Trap Generation in MOS Transistors Due to Channel Hot Carrier Stressing", IEEE Electron Device Letters, Vol. 21, No. 1, January 2000, p. 24.

SUMMARY OF THE INVENTION

It is accordingly an object of the invention to provide a method for carrying out a burn-in process for electrically stressing a semiconductor memory that overcomes the above-mentioned disadvantages of the prior art methods of this general type, which carries out a burn-in process for a memory and stabilizes the electrical characteristics of the memory.

With the foregoing and other objects in view there is provided, in accordance with the invention, a method for carrying out a burn-in process for electrically stressing semiconductor memories. The method includes providing a memory having a circuit configuration with a first voltage terminal, a second voltage terminal, a control input, and a MOS transistor. A reference-ground potential is applied to the first voltage terminal. A second voltage is applied to the second voltage terminal and a control voltage is applied to the control input, and the control voltage is then varied.

The mechanism on which the burn-in process according to the invention is based is dynamic stressing of a MOS transistor. In order to stress a MOS transistor, e.g. its source terminal is applied to a reference-ground potential, its drain terminal is applied to an operating voltage and its gate terminal is applied to an alternating voltage, which assumes values between the reference-ground potential and the operating voltage. The voltage at the drain terminal is chosen e.g. to be greater than the voltage at the gate terminal. Under these stress conditions, the properties of a transistor change as much in a few hours as in two years during normal operation. As a result, the threshold voltage of the stressed MOS transistor is stabilized and remains constant during normal operation in the memory during its expected 10-year operating life for the customer. Under the action of stress, for example the threshold voltage of the transistor is stabilized. Combinational blocks containing transistors are disposed in the circuit periphery. It is advantageous also that a defective transistor existing in the memory circuit periphery will be strongly degraded by stress and then easily identified as early as during the test phase, so that the defective memory is not supplied as a product.

In a development of the method according to the invention, the control voltage assumes voltage values which alternate between the reference-ground potential and an operating voltage. Accelerated aging of the circuit configuration is achieved by this procedure.

A further mode of the method according to the invention provides for the circuit configuration to contain a logic gate such as an inverter. The control voltage is applied to an inverter input, the reference-ground potential is applied to a first inverter voltage supply and the second voltage is applied to a second inverter voltage supply. The effect achieved by this configuration is that a transistor to be stressed is disposed in the circuit configuration. Furthermore, it is provided that the circuit configuration contains an inverter. An inverter, as the basic element of every CMOS circuit, is also contained in the circuit periphery of a memory. Moreover, logic gates and functions such as AND, NAND, OR, NOR, XOR etc., to be stressed and toggled by the control voltage, are contained in the circuit blocks.

In a development of the method according to the invention, the second voltage assumes the value of the operating voltage. By virtue of this configuration, the voltage difference between the reference-ground potential and the operating voltage is dropped across the circuit configuration.

An advantageous instance of the method according to the invention provides for the second voltage present at the second voltage terminal to alternate between the reference-ground potential and the operating voltage. The alternation of the second voltage increases the stress for the circuit configuration, so that the stressing time can be reduced and the same stress effect is achieved in a shorter time.

A development of the method according to the invention provides for the second voltage to alternate at a first frequency and the control voltage to alternate at a second frequency between the reference-ground potential and the operating voltage. The periodic alternation of the second voltage and control voltage at a fixed frequency in each case enables a simple circuitry realization of a configuration for carrying out a burn-in process.

An advantageous mode of the method according to the invention provides for the first frequency to be equal to the second frequency, and the two voltages to have a phase difference of between 150 and 210 degrees. A phase difference of 180 degrees results in that the two signals are exactly in antiphase. The tolerance range of between 150 and 210 degrees phase shift enables variation of the phase shift in the specified range, which results in a wide variety of stress configurations for the circuit configuration. A further advantageous configuration of the method according to the invention provides for the phase difference to be varied. A great variety of configurations of the operating voltage and the control voltage can be generated through the variation of the phase difference. As a result, the stress of the circuit configuration is increased further, which reduces the time for the burn-in process.

Other features which are considered as characteristic for the invention are set forth in the appended claims.

Although the invention is illustrated and described herein as embodied in a method for carrying out a burn-in process for electrically stressing a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a block diagram of a circuit configuration having voltage supply terminals;

FIG. 5 is a graph of a family of input characteristic curves of a P-channel transistor before it is stressed;

DESCRIPTION OF THE PREFERRED EMBODIMENTS

Figure 1:
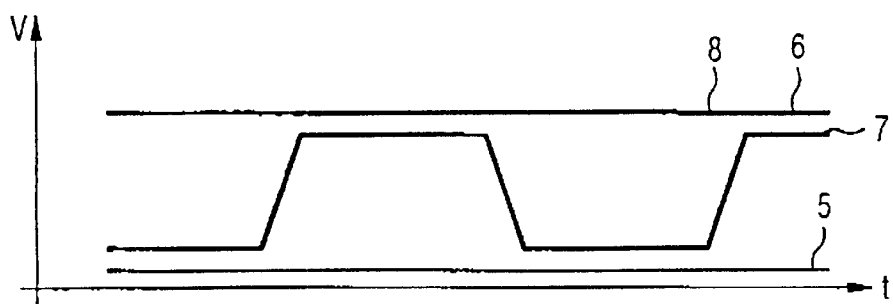
FIG. 1 is a diagram of a voltage profile according to the invention.

In all the figures of the drawing, sub-features and integral parts that correspond to one another bear the same reference symbol in each case. Referring now to the figures of the drawing in detail and first, particularly, to FIG. 4 thereof, there is shown a circuit configuration 1 having a first voltage terminal 2, a second voltage terminal 3 and a control input 4. The circuit configuration 1 is the digital logic part of a memory circuit. In the circuit configuration 1 there is a logic block 25, containing e.g. a MOS transistor or a CMOS logic gate such as an inverter. Voltage profiles are described below which are suitable for stressing the circuit configuration 25 and thus allowing it to be prematurely aged in order that the circuit configuration 25 adopts a constant behavior.

In FIG. 1, time is represented on the abscissa and voltage is represented on the ordinate. Also shown are the profile of a reference-ground potential 5, the profile of an operating voltage 8, the profile of a second voltage 6, which is identical to the profile of the operating voltage 8, and the profile of a control voltage 7. In this exemplary embodiment, the control voltage 7 alternates between the reference-ground potential 5 and the operating voltage 8. In order to stress the circuit configuration 25 with the voltage profile from FIG. 1, for example the first voltage terminal 2 is connected to the reference-ground potential 5, the second voltage terminal 3 is connected to the second voltage 6, and the control input 4 is connected to the control voltage 7. Usually, the magnitude of the voltages is chosen such that the components encompassed by the circuit configuration 25 experience an aging process but are not directly destroyed by over-voltages.

Figure 2:
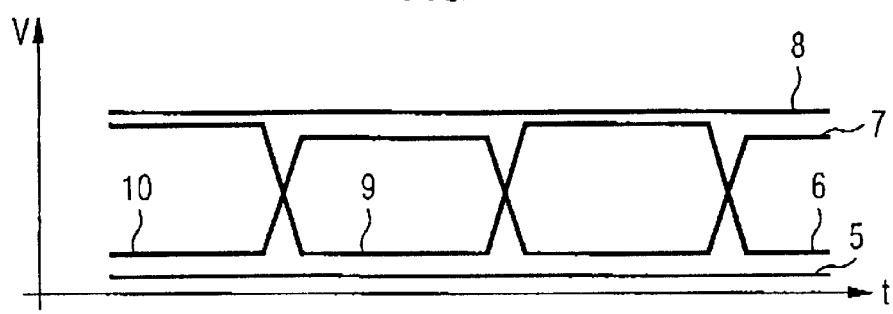
FIG. 2 is a diagram of another voltage profile.

FIG. 2 illustrates a further exemplary embodiment of a voltage profile according to the invention. The difference from FIG. 1 is that, in FIG. 2, the second voltage 6 is not kept constant at the value of the operating voltage 8, but rather alternates between the reference-ground potential 5 and the operating voltage 8. In this case, the second voltage 6 oscillates at a first frequency 9 and the control voltage 7 oscillates at a second frequency 10. In this exemplary embodiment, the two frequencies are identical but the corresponding voltages have a phase shift of about 180 degrees. As a result, the second voltage 6 reaches a high voltage value when the control voltage 7 assumes a low voltage value, and vice versa. The aging process of the circuit configuration 25 is accelerated by this procedure.

Figure 3:
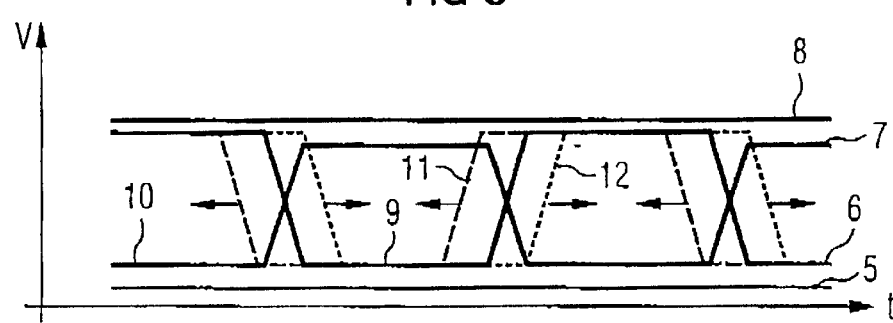
FIG. 3 is a diagram of a further voltage profile.

FIG. 3 illustrates a further exemplary embodiment of a voltage profile according to the invention. In contrast to FIG. 2, in FIG. 3 the phase angle of the second voltage 6 and of the control voltage 7 is not constant at 180 degrees, but rather can be varied in a range of ±30 degrees. The stress on the circuit configuration 25 is increased further through the variation of the phase angle, so that the time required for accelerated aging (burn-in) of the circuit configuration 1 can advantageously be reduced.

FIG. 5 shows a family of input characteristic curves of a P-channel transistor that was recorded directly after the production of the P-channel transistor. The five characteristic curves illustrated are associated with different back bias voltages that are source-Nwell voltages for PMOS, where the bottom most characteristic curve can be assigned to the lowest back bias voltage and the top most characteristic curve can be assigned to the highest back bias voltage. It can be seen that the transistor exhibits a good turn-off behavior with $10^{-11}$ ampere average even at high back bias voltages.

Figure 6:
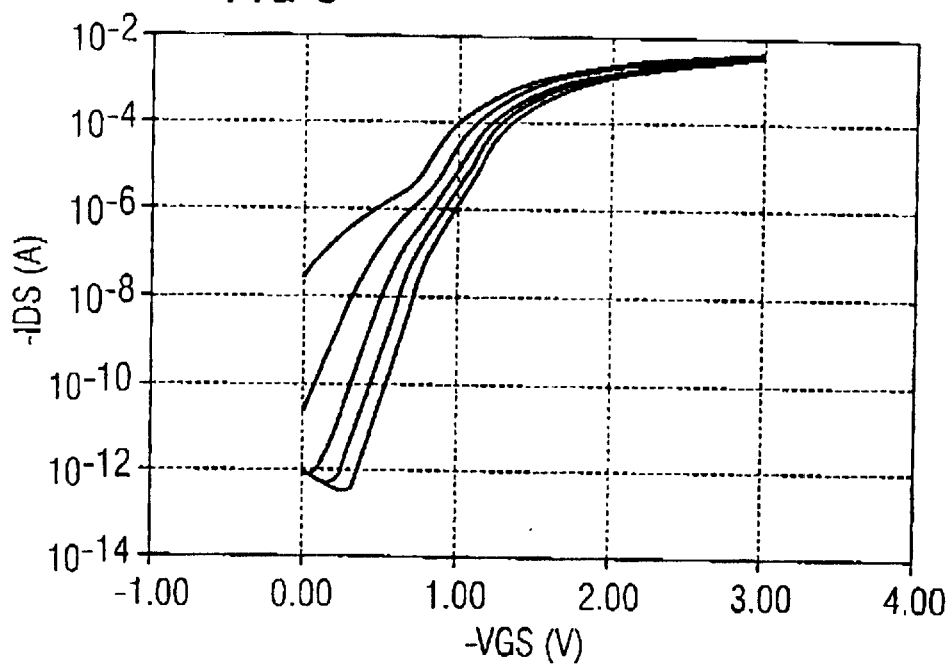
FIG. 6 is a graph of the family of input characteristic curves of the P-channel transistor after it has been stressed.

FIG. 6 illustrates the family of input characteristic curves of the transistor disclosed in FIG. 5 after the burn-in process according to the invention. It can clearly be seen that the turn-off behavior is no longer very good at high back bias voltages since the source-drain currents of about $10^{-7}$ ampere flow, which is a factor of 10,000 greater than before the burn-in process.

Figure 7:
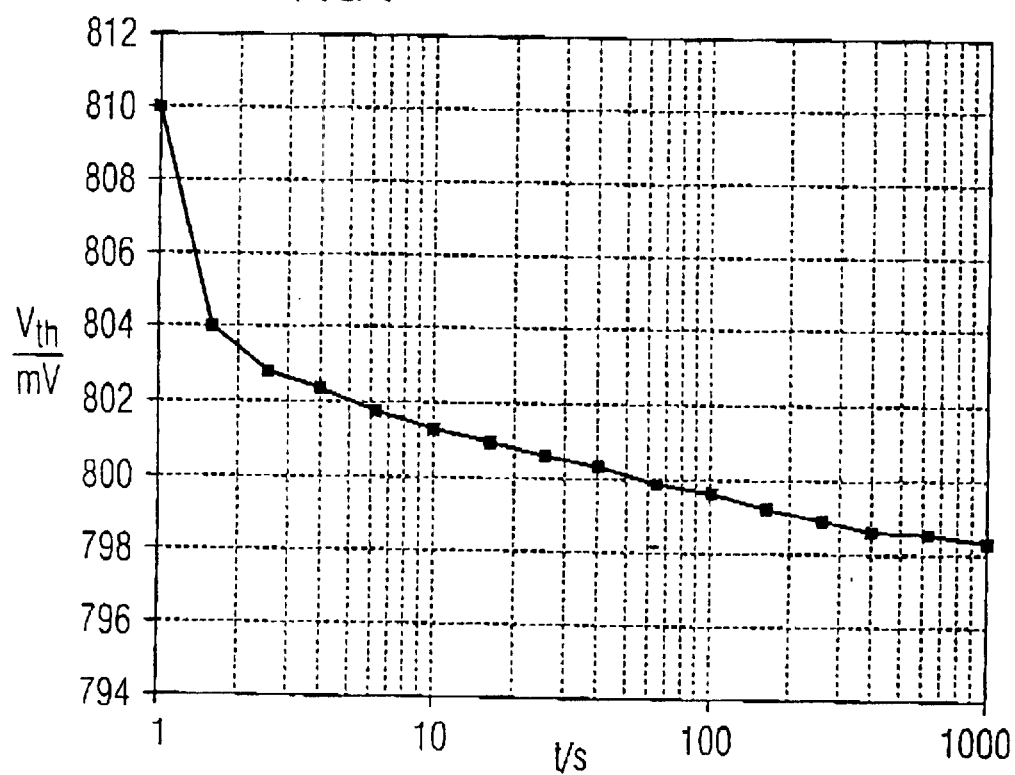
FIG. 7 is a graph showing a change in the threshold voltage under the action of stress over time.

With regard to FIG. 7, the variation of the absolute value of the threshold voltage is represented against time. It can clearly be seen that the threshold voltage decreases over the course of time and is stabilizing. This is due to a shortening in channel size of the transistor by the accumulation of trapped charges (electrons for PMOS) in the drain gate area.

The functional principle consists in the fact that a frequency present in the memory switches the transistors of the circuit on and off. In this case, gate and drain terminals of the transistors are connected via contacts to the voltage that is generated on the memory chip and is pulsed at the frequency.

Furthermore, it is advantageous to apply a temperature gradient during the electrical stress phase to the memory, in order to shorten the stress phase.

We claim:

1. A method for carrying out a burn-in process for electrically stressing semiconductor components, which comprises the steps of:
   providing a semiconductor component having a circuit configuration with a first voltage terminal, a second voltage terminal, a control input, and a MOS transistor;
   applying a reference-ground potential to the first voltage terminal;
   applying a second voltage to the second voltage terminal;
   applying a control voltage to the control input, and varying the control voltage; and
   setting the second voltage to alternate at a first frequency and the control voltage to alternate at a second frequency between the reference-ground potential and an operating voltage.

2. The method according to claim 1, which comprises providing the control voltage with voltage values which alternate between the reference-ground potential and an operating voltage.

3. The method according to claim 1, wherein the MOS transistor is part of a logic gate, the control input is a logic gate input, the first voltage terminal is a first logic gate voltage supply, and the second voltage terminal is a second logic gate voltage supply.

4. The method according to claim 1, which comprises setting the second voltage to a value of an operating voltage.

5. The method according to claim 1, which comprises setting the second voltage present at the second voltage terminal to alternate between the reference-ground potential and an operating voltage.

6. The method according to claim 1, which comprises setting the first frequency to be equal to the second frequency, and the first voltage and the second voltage have a phase difference of between 150 and 210 degrees.

7. The method according to claim 6, which comprises varying the phase difference.

* * * * *